US012019558B2

United States Patent
Nagarajan et al.

(10) Patent No.: US 12,019,558 B2
(45) Date of Patent: Jun. 25, 2024

(54) LOGICAL TO PHYSICAL ADDRESS INDIRECTION TABLE IN A PERSISTENT MEMORY IN A SOLID STATE DRIVE

(71) Applicant: Intel Corporation, Santa Clara, CA (US)

(72) Inventors: Suresh Nagarajan, Folsom, CA (US); Scott Crippin, Fair Oak, CA (US); Sahar Khalili, Vancouver (CA); Shankar Natarajan, Folsom, CA (US); Romesh Trivedi, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 594 days.

(21) Appl. No.: 17/122,152

(22) Filed: Dec. 15, 2020

(65) Prior Publication Data

US 2021/0097004 A1  Apr. 1, 2021

(51) Int. Cl.
*G06F 12/10* (2016.01)
*G06F 12/1009* (2016.01)
*G11C 16/04* (2006.01)

(52) U.S. Cl.
CPC .... *G06F 12/1009* (2013.01); *G06F 2212/657* (2013.01); *G11C 16/0483* (2013.01)

(58) Field of Classification Search
None
See application file for complete search history.

(56) References Cited

U.S. PATENT DOCUMENTS

| 10,296,224 | B2 | 5/2019 | Li et al. |
| 10,466,917 | B2 | 11/2019 | Loewen et al. |
| 10,482,010 | B2 | 11/2019 | Boyd et al. |
| 10,528,463 | B2 | 1/2020 | Li et al. |
| 11,714,748 | B1 * | 8/2023 | Harris .................. G06F 1/30 711/154 |

(Continued)

FOREIGN PATENT DOCUMENTS

| EP | 3696680 B1 * | 3/2022 | .......... G06F 11/1012 |
| GB | 2598784 A * | 3/2022 | .......... G06F 12/0862 |

OTHER PUBLICATIONS

Extended European Search Report for Patent Application No. 21198685.6, dated Apr. 5, 2022, 6 pages.
(Continued)

*Primary Examiner* — Kevin Verbrugge
(74) *Attorney, Agent, or Firm* — Compass IP Law PC

(57) ABSTRACT

A solid state drive with a Logical To Physical (L2P) indirection table stored in a persistent memory is provided. The L2P indirection table has a plurality of entries, each entry to store a physical block address in the block addressable memory assigned to a logical block address. The solid state drive including solid state drive controller circuitry communicatively coupled to the persistent memory and the block addressable memory. The solid state drive controller circuitry including a volatile memory to store a logical to physical address indirection table cache and circuitry to monitor the logical to physical address indirection table cache and to write dirty logical to physical entries in the logical to physical address indirection table cache to the logical to physical address indirection table in the persistent memory.

20 Claims, 6 Drawing Sheets

(56) References Cited

U.S. PATENT DOCUMENTS

| | | | |
|---|---|---|---|
| 2007/0300037 A1* | 12/2007 | Rogers | G06F 12/0866 |
| | | | 711/E12.019 |
| 2010/0037001 A1 | 2/2010 | Langlois et al. | |
| 2012/0096246 A1 | 4/2012 | Pio et al. | |
| 2014/0181375 A1* | 6/2014 | Miyamoto | G06F 12/0868 |
| | | | 711/103 |
| 2014/0317337 A1 | 10/2014 | Puthiyedath et al. | |
| 2017/0139642 A1 | 5/2017 | Tan | |
| 2019/0042460 A1 | 2/2019 | Trika et al. | |
| 2019/0272236 A1* | 9/2019 | Li | G06F 12/0891 |
| 2019/0354482 A1* | 11/2019 | Lee | G06F 12/0804 |
| 2020/0272577 A1 | 8/2020 | Zeng et al. | |
| 2021/0081141 A1 | 11/2021 | Curewitz et al. | |
| 2023/0281123 A1* | 9/2023 | Harris | G06F 3/064 |
| | | | 711/207 |

OTHER PUBLICATIONS

Notice of Allowance for U.S. Appl. No. 17/122,158, Mailed Feb. 5, 2024, 8 pages.

European First Office Action, (EP Exam Report Article 94(3) EPC), for Patent Application No. 21198685.6, Mailed Apr. 19, 2024, 6 pages.

* cited by examiner

| LBA | L2P | |
|---|---|---|
| 0 | PLOC-A | META-A |
| 1 | PLOC-C | META-C |
| 2 | PLOC-B | META-B |
| 3 | PLOC-Z | META-Z |
| 4 | PLOC-X | META-X |
| 5 | PLOC-Y | META-Y |
| ... | ... | ... |
| ... | ... | ... |
| MAXLBA | PLOC-ZZ | META-ZZ |

LOGICAL TO PHYSICAL ADDRESS INDIRECTION TABLE IN A PERSISTENT MEMORY IN A SOLID STATE DRIVE

FIELD

This disclosure relates to storage devices and in particular to a Logical to Physical (L2P) address indirection table stored in a persistent memory in a solid state drive.

BACKGROUND

A computer system typically includes a volatile system memory, for example, a Dynamic Random Access Memory (DRAM) and a storage device. The storage device may be a solid state Drive (SSD) that includes block addressable non-volatile memory.

A logical block is the smallest addressable data unit for read and write commands to access the block addressable non-volatile memory in the solid state Drive. The address of the logical block is commonly referred to as a Logical Block Address (LBA).

A logical to physical (L2P) address indirection table stores a physical block address in block addressable non-volatile memory in the solid state drive corresponding to each LBA. The size of the L2P address table is dependent on the user-capacity of the solid state drive. Typically, the size of the L2P address table is about one Mega Byte (MB) per Giga Byte (GB) of user-capacity in the solid state drive.

BRIEF DESCRIPTION OF THE DRAWINGS

Features of embodiments of the claimed subject matter will become apparent as the following detailed description proceeds, and upon reference to the drawings, in which like numerals depict like parts, and in which:

FIG. 2 is an example of the solid state drive L2P Indirection Table shown in FIG. 1;

Figure 1:
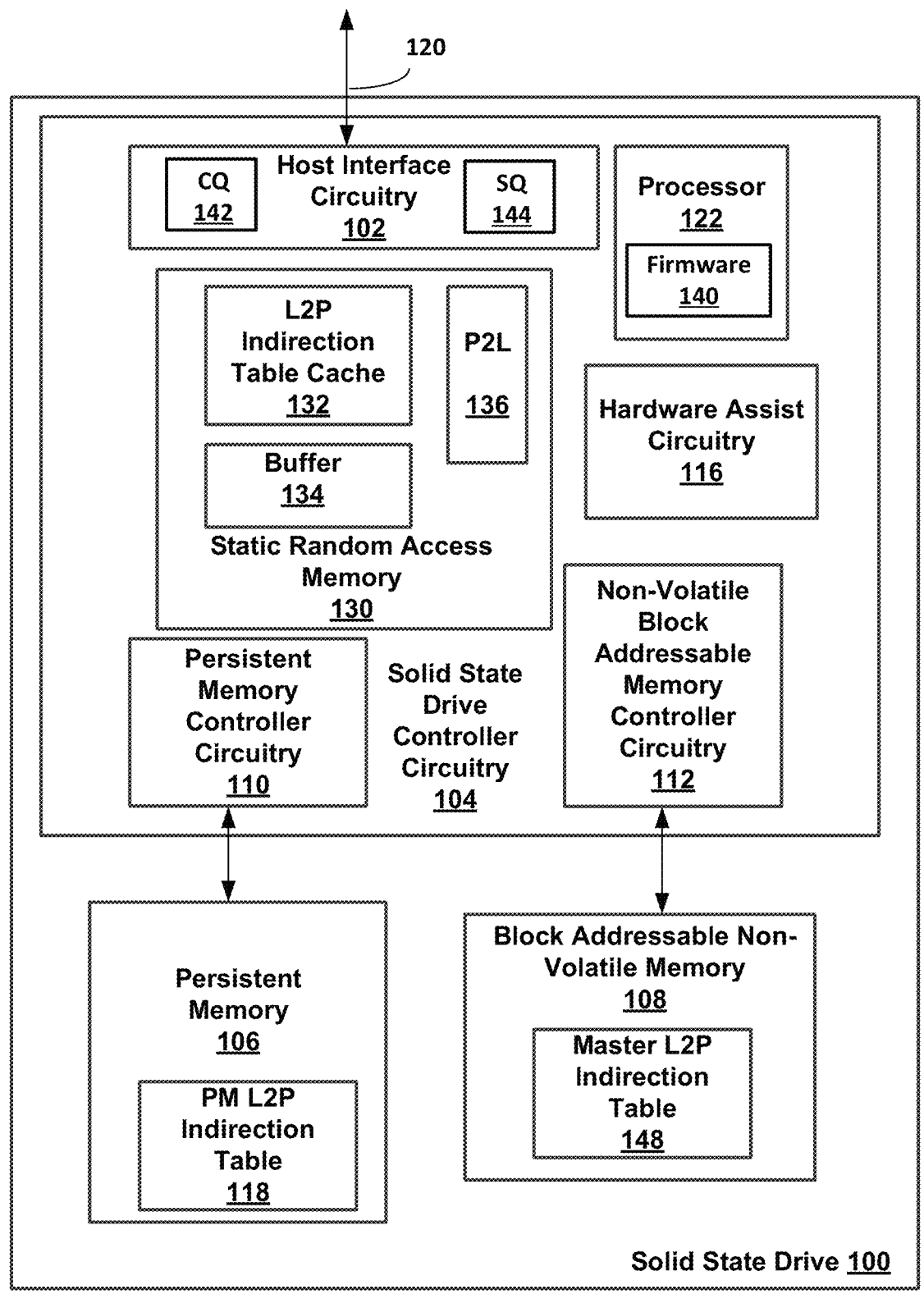
FIG. 1 is a block diagram of an embodiment of a solid state drive.

Although the following Detailed Description will proceed with reference being made to illustrative embodiments of the claimed subject matter, many alternatives, modifications, and variations thereof will be apparent to those skilled in the art. Accordingly, it is intended that the claimed subject matter be viewed broadly, and be defined as set forth in the accompanying claims.

DESCRIPTION OF EMBODIMENTS

An L2P address table (also referred to as an L2P indirection table or L2P table) is stored in a byte-addressable volatile memory (for example, Dynamic Random Access Memory (DRAM) or Synchronous Dynamic Random Access memory (SDRAM)). The L2P table is stored in byte-addressable volatile memory to speed up the reading of the physical block address from the L2P indirection table to access the physical block in block addressable non-volatile memory (for example, NAND flash memory) in the solid state drive. The byte-addressable volatile memory to store the L2P indirection table can be included in the solid state drive or in a host communicatively coupled to the solid state drive.

The L2P indirection table can be stored in a host memory buffer, for example in a portion of system DRAM. On every write (update) to the L2P indirection table in the host memory buffer, the L2P indirection table stored in the block addressable non-volatile memory in the solid state drive is written at the same time (write-through mode). The performance of the write to the L2P table is based on the longest write time, that is, the time to write to the block addressable non-volatile memory or the host memory buffer.

The L2P indirection table can be stored in a byte-addressable volatile memory in the solid state drive. However, the size of the L2P indirection table is dependent on the user-capacity of the solid state drive (for example, about one Mega Byte (MB) per Giga Byte (GB) of user-capacity). An increase in the non-volatile memory (also referred to as user-capacity) in the solid state drive requires a corresponding increase the byte-addressable volatile memory to store the L2P indirection table.

In an embodiment, performance of the write to the L2P indirection table is increased by storing the L2P indirection table in a persistent memory in the solid state drive.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

FIG. 1 is a block diagram of an embodiment of a solid state drive 100. The solid state drive 100 includes solid state drive controller circuitry 104, a persistent memory 106 and a block addressable non-volatile memory 108.

The solid state drive controller circuitry 104 includes host interface circuitry 102, persistent memory controller circuitry 110, non-volatile block addressable memory controller circuitry 112, a processor 122, firmware 140, hardware assist circuitry 116 and a static random access memory 130. The solid state drive controller circuitry 104 can be included in a Field Programmable Gate Array (FPGA) or an Application Specific Integrated Circuit (ASIC).

A host system can communicate with the solid state drive 100 over a high-speed serial computer expansion bus 120, for example, a Peripheral Component Interconnect Express (PCIe) bus. The host interface circuitry 102 manages the communication over the Peripheral Component Interconnect Express (PCIe) bus. In an embodiment, the host system communicates over the Peripheral Component Interconnect Express (PCIe) bus using a Non-Volatile Memory Express (NVMe) standard protocol. The Non-Volatile Memory Express (NVMe) standard protocol defines a register level interface for host software to communicate with the Solid State Drive (SSD) 100 over the Peripheral Component Interconnect Express (PCIe) bus. The NVM Express standards are available at www.nvmexpress.org. The PCIe standards are available at pcisig.com.

The NVM Express interface allows host software to communicate with the solid state drive 100 over the high-speed serial computer expansion bus 120 based on a paired submission and completion queue mechanism. Submission queues (SQ) 144 and completion queues (CQ) 142 are allocated in memory. A submission queue 144 is a circular buffer with a fixed slot size that the host software uses to submit commands for execution by the solid state drive controller circuitry 104. A completion queue 142 is a circular buffer with a fixed slot size used to post status for completed commands.

An NVMe command set is used for the paired submission and completion queues. Host software inserts commands from the NVMe command set into a submission queue 144 for execution by the solid state drive controller circuitry 104. The solid state drive controller circuitry 104 inserts completions into the associated completion queue 142.

A portion of the static random access memory 130 is allocated as a L2P indirection table cache 132 to store a portion of a persistent memory (PM) L2P indirection table 118 that is stored in the persistent memory 106. Another portion of the static random access memory 130 is allocated as a buffer 134 to store data transferred over the high-speed serial computer expansion bus 120. In an embodiment, the static random access memory 130 is one or more Mega Bytes (MB).

Another portion of the static random access memory 130 is allocated as a Physical-To-Logical (P2L) indirection table 136. The L2P indirection table cache 132 and the Physical-To-Logical (P2L) indirection table 136 both store physical block addresses in block addressable non-volatile memory in the solid state drive corresponding to Logical Block Addresses. The entries in the P2L indirection table 136 are static (not updated after they are written). The entries in the L2P indirection table cache 132 are dynamically updated.

The static random access memory 130 is a volatile memory. Volatile memory is memory whose state (and therefore the data stored in it) is indeterminate if power is interrupted to the device. SRAM is a type of volatile memory that uses latching circuitry to store each bit. SRAM is typically used as a cache memory because in contrast to Dynamic Random Access Memory (DRAM) the data stored in SRAM does not need to be periodically refreshed.

Persistent memory 106 and block addressable non-volatile memory 108 are non-volatile memory. A non-volatile memory (NVM) device is a memory whose state is determinate even if power is interrupted to the device. In one embodiment, the Block Addressable non-volatile memory 108 is a NAND Flash memory, or more specifically, multi-threshold level NAND flash memory (for example, Single-Level Cell ("SLC"), Multi-Level Cell ("MLC"), Tri-Level Cell ("TLC"), Quad-Level Cell ("QLC"), Penta-Level Cell ("PLC") or some other NAND Flash memory).

The block addressable non-volatile memory 108 includes at least one non-volatile memory die, for example a NAND Flash die. Typically, data is written (striped) across many NAND Flash die in the SSD to optimize the write bandwidth. The non-volatile memory on the non-volatile memory die includes a plurality of blocks, with each block including a plurality of pages. Each page in the plurality of pages to store data and associated metadata. In an embodiment, the non-volatile memory die has 2048 blocks, each block has 64 pages, and each page can store 2048 bytes of data and 64 bytes of metadata.

Persistent Memory 106 is a byte addressable write-in-place non-volatile memory. Examples of byte addressable write-in-place non-volatile memory devices include a three dimensional cross-point memory device, single or multi-level Phase Change Memory (PCM) or phase change memory with a switch (PCMS), INTEL OPTANE, non-volatile memory devices that use chalcogenide phase change material (for example, chalcogenide glass), resistive memory including metal oxide base, oxygen vacancy base and Conductive Bridge Random Access Memory (CB-RAM), nanowire memory, ferroelectric random access memory (FeRAM, FRAM), magneto resistive random access memory (MRAM) that incorporates memristor technology, spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory.

The hardware assist circuitry 116 (also referred to as circuitry 116) manages data transfer between the persistent memory 106 and the block addressable non-volatile memory 108. A portion of the persistent memory 106 is allocated to store the PM L2P indirection table 118. A portion of the block addressable non-volatile memory 108 is used to store a master L2P indirection table 148. The size of the PM L2P indirection table 118 is dependent on the capacity of the block addressable non-volatile memory 108 based on a ratio of 1:1000, for example, the PM L2P indirection table 118 in persistent memory 106 is 1 Mega Byte (MB) per 1 Giga Bytes (GB) of block addressable non-volatile memory 108. The PM L2P indirection table 118 is a copy of the master L2P indirection table 148. Both the PM L2P indirection table 118 and master L2P indirection table 148 are stored in non-volatile memory and are periodically synced during operation of the solid state drive 100.

The remainder of the persistent memory 106 can be used to store the PM L2P indirection table 118, user data, persistent memory metadata and host metadata. persistent memory/host metadata. In an embodiment, about 5% of the persistent memory is used to store the PM L2P indirection table 118, about 5% is used to store persistent memory/host metadata and about 90% is used to store user data.

In an embodiment, the user data stored in persistent memory 106 can include frequently accessed user data, operating system files and executable programs. The frequently accessed user data can be referred to a "hot" user data. Non-frequently accessed data, also referred to as "cold" user data can be stored in the block addressable non-volatile memory 108. The persistent memory 106 can be referred to as "storage accelerator memory" because read latency for persistent memory 106 is less than the read latency for the block addressable non-volatile memory 108.

In other embodiments, the persistent memory 106 can be SLC NAND and the block addressable non-volatile memory can be NAND with more than one bit per cell (for example, MLC, TLC, QLC, PLC NAND). Read latency for SLC NAND is faster than for NAND with more than one bit per cell.

The Non-Volatile Block Addressable Memory Controller Circuitry 112 in the solid state drive controller circuitry 104 queues and processes commands (for example, read, write ("program"), erase commands for user data stored in the block addressable non-volatile memory 108.

The solid state drive 100 does not include a Dynamic Random Access Memory (DRAM) and may be referred to as a DRAMLess solid state drive.

Figure 2:
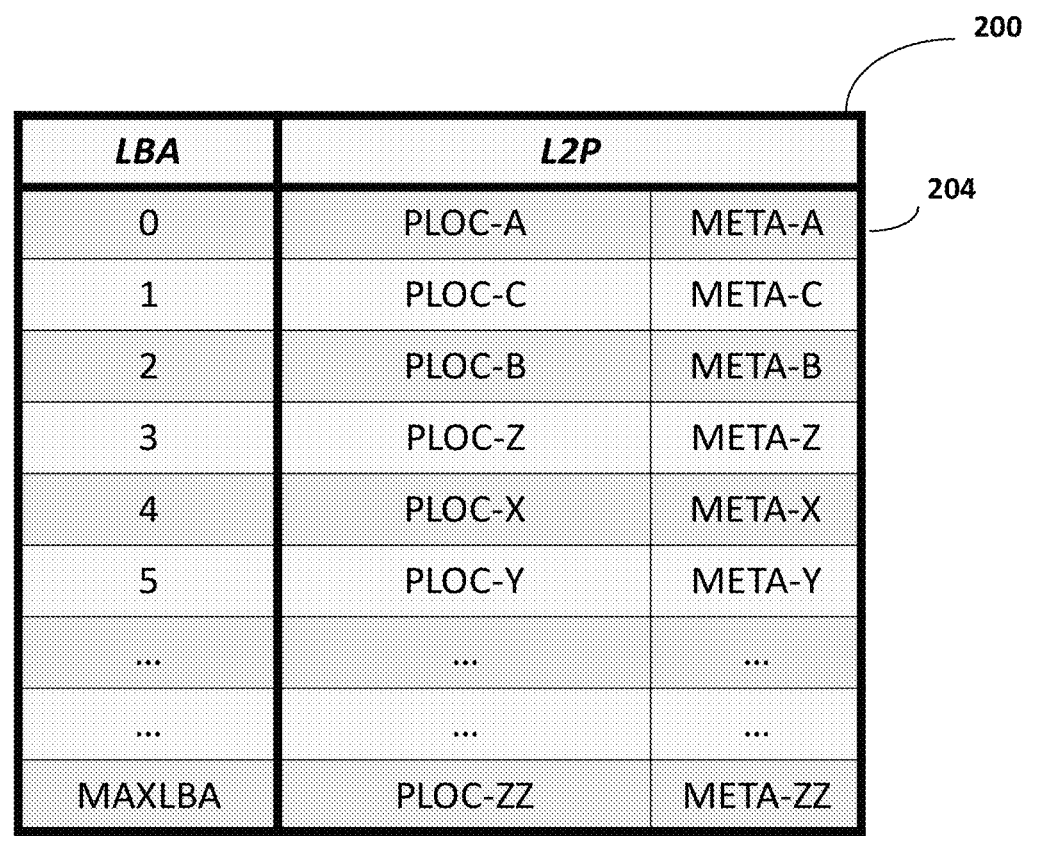

FIG. 2 is an example of the PM L2P indirection table 118 shown in FIG. 1 that may be stored in the in the persistent memory 106 shown in FIG. 1. Each L2P entry ("row") 204 in the solid state drive PM L2P indirection table 118 stores a physical location ("PLOC") in the block addressable non-volatile memory 108 in the solid state drive 100. The physical location corresponds to the Logical Block Address (LBA) (table indices from index 0 to MAXLBA). The L2P entry 204 also includes metadata ("META").

In an embodiment in which the block addressable non-volatile memory 108 in the solid state drive 100 includes one or more NAND Flash dies, a PLOC is the physical location in the one or more NAND Flash dies where data is stored for a particular LBA. For example, in L2P entry 204, physical location A ("PLOC-A") corresponding to LBA 0 may be NAND Flash die-0, block-1, page-1, offset-0.

Metadata is data that provides information about other data. For example, one bit of the metadata may be a "lock bit" to prevent read/write access to the PLOC in the L2P entry 204 in the L2P indirection table 200. Another bit of the metadata may be a "dirty bit", the state of which indicates whether user data for the L2P entry 204 has been flushed to the block addressable non-volatile memory 108 in the solid state drive 100. The dirty bit for the L2P entry 204 is set to "dirty" when the L2P entry 204 is written.

In an embodiment, there are multiple levels of L2P indirection tables, the L2P indirection table cache 132, the PM L2P indirection table 118 and the master L2P indirection table 148. Firmware 140 executed by processor 122 performs an initial search for the L2P entry in the L2P indirection table cache 132 in the static random access memory 130 and a next search in the PM L2P indirection table 118 in persistent memory 106. If the L2P location is not in the L2P indirection table cache 132 in the static random access memory 130 or the PM L2P indirection table 118 in persistent memory 106, the L2P entry is in master L2P indirection table 148 in the block addressable non-volatile memory 108.

Figure 3:
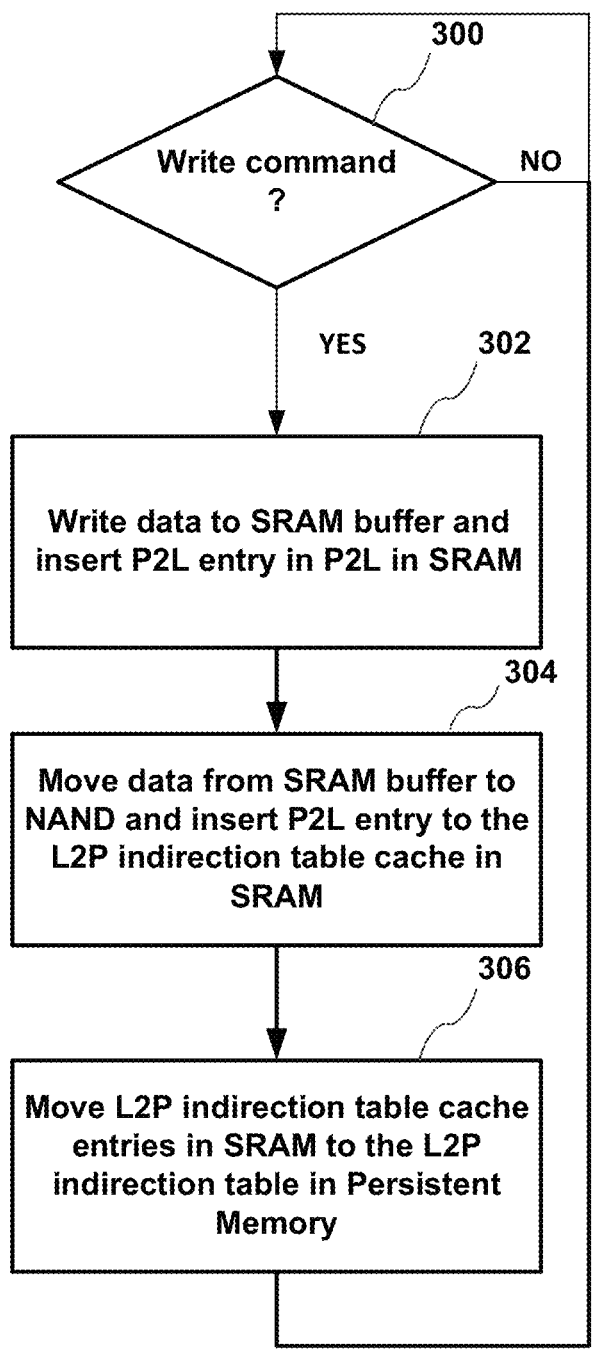
FIG. 3 is a flowgraph of operations performed in the solid state drive in response to a write command received from an operating system executing on the host system.

FIG. 3 is a flowgraph of operations performed in the solid state drive 100 in response to a write command received from an operating system executing on the host system.

As discussed earlier, the submission queue is a circular buffer with a fixed slot size. An operating system executing in the host system can insert commands in the submission queue for execution by the solid state drive controller circuitry 104. The firmware 140 in the processor 122 fetches commands from the submission queue in order and can execute the commands in any order.

At block 300, if there is a write command on the submission queue to be processed, processing continues with block 302.

At block 302, the firmware 140 in the processor 122 executes a write command fetched from the submission queue 144 in the host interface circuitry 102. Data to be written to the solid state drive 100 that is received from the host via the host interface circuitry 102 is written to the buffer 134 and a P2L entry is inserted in the P2L indirection table 136.

At block 304, data stored in the buffer 134 is moved to the block addressable non-volatile memory 108 and the P2L entry in the P2L indirection table 136 table is inserted in the L2P indirection table cache 132.

At block 306, the entries in the L2P indirection table cache 132 are moved to the PM L2P indirection table 118 in persistent memory 106. The number of entries in the L2P indirection table cache 132 that are accumulated is dependent on the minimum transfer size to the persistent memory 106. Processing continues with block 300 to process another write request from the submission queue.

Figure 4:
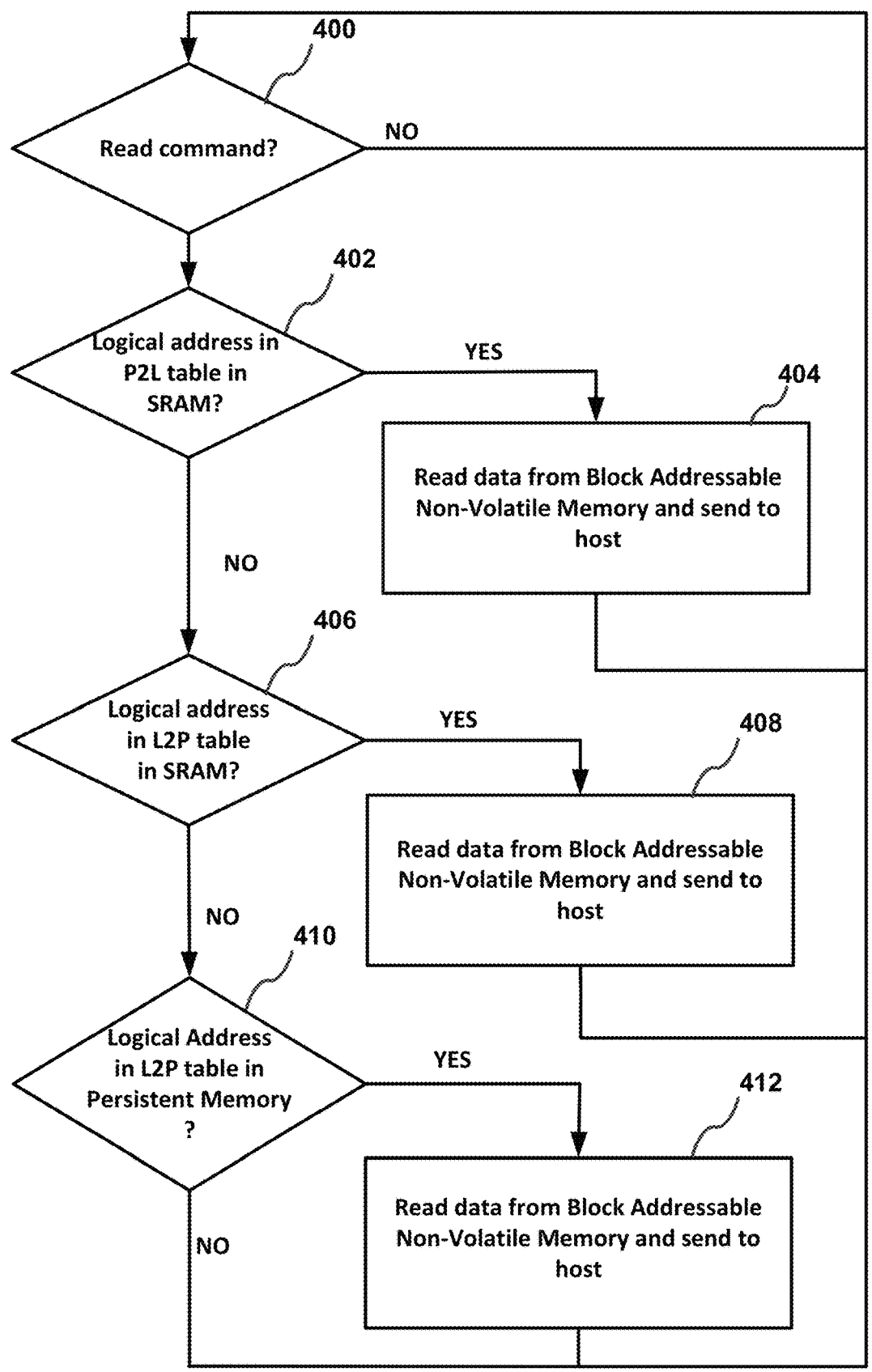
FIG. 4 is a flowgraph of operations performed in the solid state drive in response to a read command received from an operating system executing on the host system.

FIG. 4 is a flowgraph of operations performed in the solid state drive 100 in response to a read command received from an operating system executing on the host system. In an embodiment, the read command is an NVMe read command. The NVMe read command can be sent to both the persistent memory 106 and the block addressable non-volatile memory 108. An NVMe read command can result in a read of metadata stored in the persistent memory 106.

The operating system executing on the host system can insert a read command in the submission queue for execution by the firmware 140 in the processor 122. The solid state drive controller circuitry 104 fetches the read command from the submission queue. The read command includes a logical block address for the data to be read from the block addressable non-volatile memory 108 or the persistent memory 106 in the solid state drive 100.

At block 400, if there is a read command on the submission queue to be processed, the solid state drive controller circuitry 104 fetches the read command from the submission queue, processing continues with block 402.

At block 402, the solid state drive controller circuitry 104 in the solid state drive 100 searches the P2L indirection table 136 in the static random access memory 130 in the solid state drive 100 for a P2L entry corresponding to the logical block address. If there is a P2L entry corresponding to the logical block address for the data to be read, processing continues with block 404. If not, processing continues with block 406.

At block 404, the physical address of the physical block corresponding to the logical block address is read from the L2P entry in the P2L indirection table 136. Data is read from the block addressable non-volatile memory 108 at the physical block in the P2L entry in the P2L indirection table 136 corresponding to the logical block address. Processing continues with block 400 to fetch another read command from the submission queue.

At block 406, the solid state drive controller circuitry 104 in the solid state drive 100 searches the L2P indirection table cache 132 in the static random access memory 130 in the solid state drive 100 for an L2P entry corresponding to the logical block address. If there is a L2P entry corresponding to the logical block address for the data to be read, processing continues with block 408. If not, processing continues with block 410.

At block 408, the physical address of the physical block corresponding to the logical block address is read from the L2P entry in the L2P indirection table cache 132 in the static random access memory 130. Data is read from the block addressable non-volatile memory 108 at the physical block in the L2P entry in the L2P indirection table cache 132 corresponding to the logical block address. Processing continues with block 400 to fetch another read command from the submission queue.

At block 410, the solid state drive controller circuitry 104 in the solid state drive 100 searches the PM L2P indirection table 118 in persistent memory 106 in the solid state drive 100 for an L2P entry corresponding to the logical block address. If there is a L2P entry corresponding to the logical block address for the data to be read, processing continues with block 412. If not, processing continues with block 400.

At block 412, the physical address of the physical block corresponding to the logical block address is read from the L2P entry in the PM L2P indirection table 118. Data is read from the physical block in the block addressable non-volatile memory 108. Processing continues with block 400 to fetch another read command from the submission queue.

The solid state drive controller circuitry 104 can read and write a page of data from a block of data in the block addressable non-volatile memory 108 but can only erase at a block level. The solid state drive controller circuitry 104 cannot overwrite data in the block-addressable non-volatile memory until the data has been erased. To ensure that read/write performance is not impacted by erase operations, erase operations also known as "garbage collection," are aggregated. An operating system identifies files and data that are no longer needed and can be erased by issuing a TRIM command to the solid state drive 100.

Figure 5:
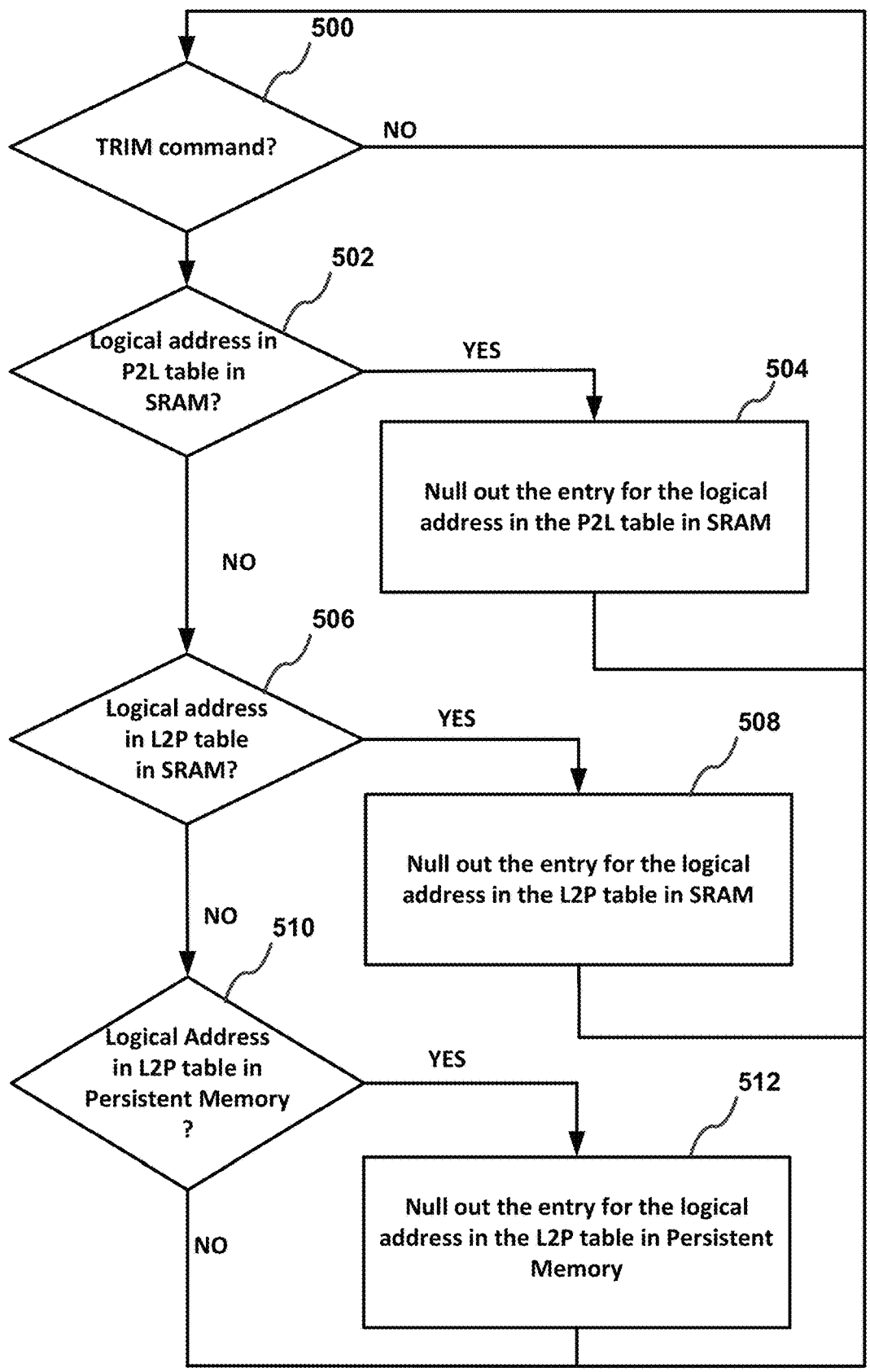
FIG. 5 is a flowgraph of operations performed in the solid state drive in response to a TRIM command received from an operating system executing on the host system.

FIG. 5 is a flowgraph of operations performed in the solid state drive 100 in response to a TRIM command received from an operating system executing on the host system. An example of a TRIM command is the NVMe Deallocate command. The TRIM command identifies blocks in the block addressable non-volatile memory 108 that can be erased.

At block 500, if there is a TRIM command on the submission queue to be processed, the solid state drive controller circuitry 104 fetches the TRIM command from the submission queue, processing continues with block 502.

At block 502, the P2L indirection table 136 in the static random access memory 130 in the solid state drive 100 is searched for a P2L entry or entries corresponding to the logical block address or a range of logical block addresses to be erased. If there is a P2L entry corresponding to the logical block address, processing continues with block 504. If not, processing continues with block 406.

At block 504, the entry in the P2L indirection table corresponding to the logical block address is cleared. Processing continues with block 500.

At block 506, the solid state drive controller circuitry 104 in the solid state drive 100 searches the L2P indirection table cache 132 in the static random access memory 130 in the solid state drive 100 for an L2P entry corresponding to the logical block address. If there is a L2P entry corresponding to the logical block address for the data to be read, processing continues with block 508. If not, processing continues with block 510.

At block 508, the L2P entry in the L2P indirection table cache 132 in the static random access memory 130 is cleared. Processing continues with block 500.

At block 510, the solid state drive controller circuitry 104 in the solid state drive 100 searches the PM L2P indirection table 118 in persistent memory 106 in the solid state drive 100 for an L2P entry corresponding to the logical block address. If there is a L2P entry corresponding to the logical block address for the data to be read, processing continues with block 512. If not, processing continues with block 500.

At block 512, the L2P entry in the PM L2P indirection table 118 in the persistent memory 106 is cleared. For example, all of the bits in the entry may be clears by writing all of the bits to logical 1 or logical 0. Processing continues with block 500.

Storing the L2P indirection table in the persistent memory reduces the frequency and increases the granularity of updates to the PM L2P indirection table 118 in the persistent memory 106. In addition, the use of a hardware assist circuitry 116 to update the master L2P indirection table 148 in the block addressable non-volatile memory 108 provides more bandwidth to store update the master L2P indirection table 148 and to store data in the block addressable non-volatile memory 108.

Figure 6:
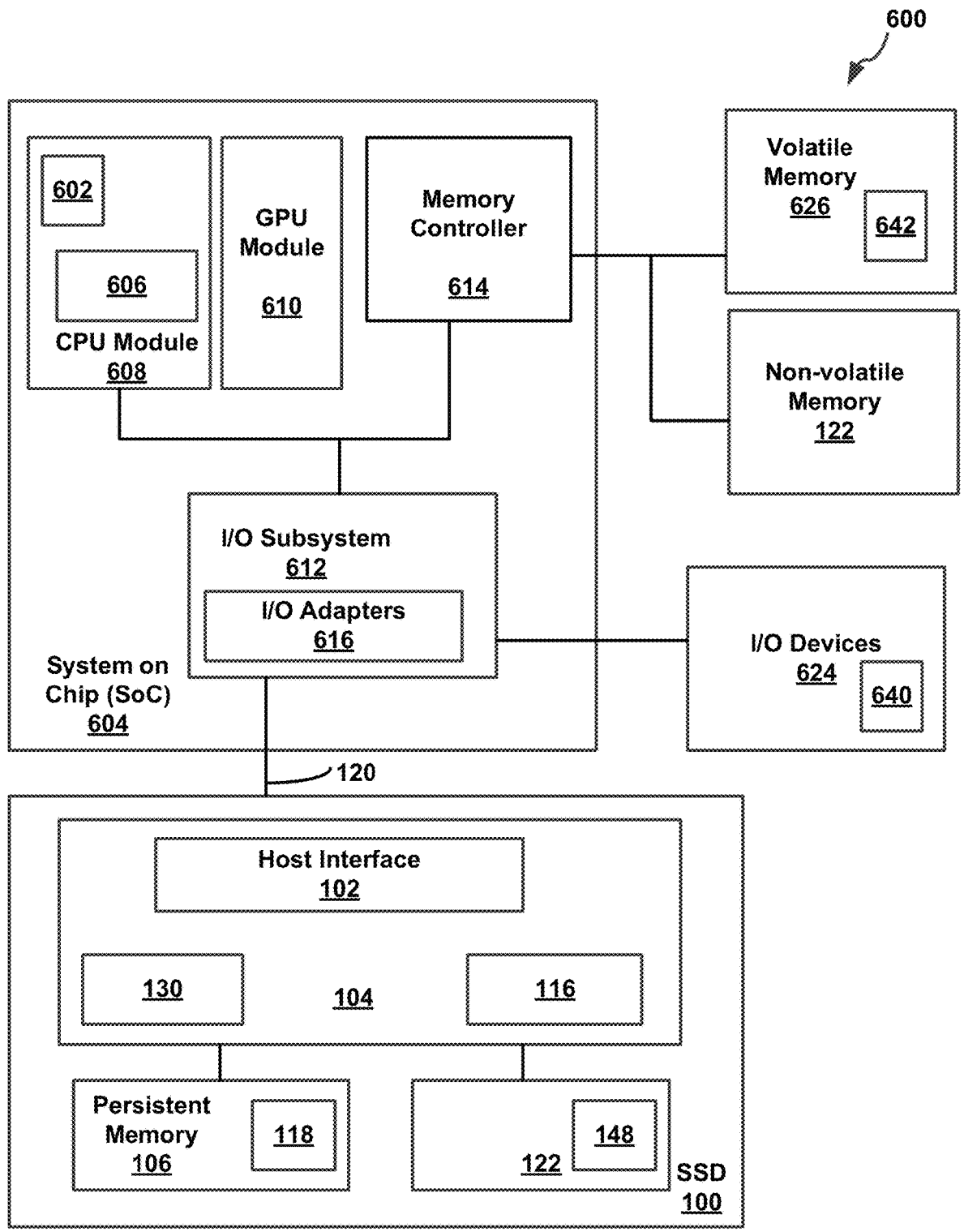
FIG. 6 is a block diagram of an embodiment of a computer system that includes a persistent memory in a solid state drive to store a L2P indirection table.

FIG. 6 is a block diagram of an embodiment of a computer system 600 that includes a persistent memory 106 in a solid state drive 100 to store a PM L2P indirection table 118. Computer system 600 can correspond to a computing device including, but not limited to, a server, a workstation computer, a desktop computer, a laptop computer, and/or a tablet computer.

The computer system 600 includes a system on chip (SOC or SoC) 604 which combines processor, graphics, memory, and Input/Output (I/O) control logic into one SoC package. The SoC 604 includes at least one Central Processing Unit (CPU) module 608, a volatile memory controller 614, and a Graphics Processor Unit (GPU) 610. In other embodiments, the volatile memory controller 614 can be external to the SoC 604. The CPU module 608 includes at least one processor core 602, and a level 2 (L2) cache 606.

Although not shown, each of the processor core(s) 602 can internally include one or more instruction/data caches, execution units, prefetch buffers, instruction queues, branch address calculation units, instruction decoders, floating point units, retirement units, etc. The CPU module 608 can correspond to a single core or a multi-core general purpose processor, such as those provided by Intel® Corporation, according to one embodiment.

The Graphics Processor Unit (GPU) 610 can include one or more GPU cores and a GPU cache which can store graphics related data for the GPU core. The GPU core can internally include one or more execution units and one or more instruction and data caches. Additionally, the Graphics Processor Unit (GPU) 610 can contain other graphics logic units that are not shown in FIG. 6, such as one or more vertex processing units, rasterization units, media processing units, and codecs.

Within the I/O subsystem 612, one or more I/O adapter(s) 616 are present to translate a host communication protocol utilized within the processor core(s) 602 to a protocol compatible with particular I/O devices. Some of the protocols that adapters can be utilized for translation include Peripheral Component Interconnect (PCI)-Express (PCIe); Universal Serial Bus (USB); Serial Advanced Technology Attachment (SATA) and Institute of Electrical and Electronics Engineers (IEEE) 1594 "Firewire".

The I/O adapter(s) 616 can communicate with external I/O devices 624 which can include, for example, user interface device(s) including a display and/or a touch-screen display 640, printer, keypad, keyboard, communication logic, wired and/or wireless, storage device(s) including hard disk drives ("HDD"), solid state drives ("SSD"), removable storage media, Digital Video Disk (DVD) drive, Compact Disk (CD) drive, Redundant Array of Independent Disks (RAID), tape drive or other storage device. The storage devices can be communicatively and/or physically coupled together through one or more buses using one or more of a variety of protocols including, but not limited to, SAS (Serial Attached SCSI (Small Computer System Interface)), PCIe (Peripheral Component Interconnect Express), NVMe (NVM Express) over PCIe (Peripheral Component Interconnect Express), and SATA (Serial ATA (Advanced Technology Attachment)).

Additionally, there can be one or more wireless protocol I/O adapters. Examples of wireless protocols, among others, are used in personal area networks, such as IEEE 802.15 and Bluetooth, 4.0; wireless local area networks, such as IEEE 802.11-based wireless protocols; and cellular protocols.

The I/O adapter(s) 616 can also communicate with a solid state drive ("SSD") 100 which includes solid state drive controller circuitry 104 and persistent memory 106 to store the PM L2P indirection table 118 discussed in conjunction with FIG. 1.

The I/O adapter(s) 616 can include a Peripheral Component Interconnect Express (PCIe) adapter that is communicatively coupled using the NVMe (NVM Express) over PCIe (Peripheral Component Interconnect Express) protocol over the high-speed serial computer expansion bus 120 to the host interface circuitry 102 in the solid state drive 100. Non-Volatile Memory Express (NVMe) standards define a register level interface for host software to communicate with a non-volatile memory subsystem (for example, a Solid state Drive (SSD)) over Peripheral Component Interconnect Express (PCIe), a high-speed serial computer expansion bus). The NVM Express standards are available at www.nvmexpress.org. The PCIe standards are available at www.pcisig.com.

Volatile memory is memory whose state (and therefore the data stored in it) is indeterminate if power is interrupted to the device. Dynamic volatile memory requires refreshing the data stored in the device to maintain state. One example of dynamic volatile memory includes DRAM (Dynamic Random Access Memory), or some variant such as Synchronous DRAM (SDRAM). A memory subsystem as described herein can be compatible with a number of memory technologies, such as DDR3 (Double Data Rate version 3, original release by JEDEC (Joint Electronic Device Engineering Council) on Jun. 27, 2007). DDR4 (DDR version 4, initial specification published in September 2012 by JEDEC), DDR4E (DDR version 4), LPDDR3 (Low Power DDR version3, JESD209-3B, August 2013 by JEDEC), LPDDR4) LPDDR version 4, JESD209-4, originally published by JEDEC in August 2014), WIO2 (Wide Input/Output version 2, JESD229-2 originally published by JEDEC in August 2014, HBM (High Bandwidth Memory, JESD325, originally published by JEDEC in October 2013, DDR5 (DDR version 5, currently in discussion by JEDEC), LPDDR5 (currently in discussion by JEDEC), HBM2 (HBM version 2), currently in discussion by JEDEC, or others or combinations of memory technologies, and technologies based on derivatives or extensions of such specifications. The JEDEC standards are available at www.jedec.org.

An operating system 642 is software that manages computer hardware and software including memory allocation and access to I/O devices. Examples of operating systems include Microsoft® Windows®, Linux®, iOS® and Android®.

Flow diagrams as illustrated herein provide examples of sequences of various process actions. The flow diagrams can indicate operations to be executed by a software or firmware routine, as well as physical operations. In one embodiment, a flow diagram can illustrate the state of a finite state machine (FSM), which can be implemented in hardware and/or software. Although shown in a particular sequence or order, unless otherwise specified, the order of the actions can be modified. Thus, the illustrated embodiments should be understood as an example, and the process can be performed in a different order, and some actions can be performed in parallel. Additionally, one or more actions can be omitted in various embodiments; thus, not all actions are required in every embodiment. Other process flows are possible.

To the extent various operations or functions are described herein, they can be described or defined as software code, instructions, configuration, and/or data. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope.

Therefore, the illustrations and examples herein should be construed in an illustrative, and not a restrictive sense. The scope of the invention should be measured solely by reference to the claims that follow.

What is claimed is:

1. A solid state drive comprising:
a block addressable non-volatile memory to store data;
a persistent memory to store a logical to physical address indirection table, the logical to physical address indirection table having a plurality of entries, each entry to store a physical block address in the block addressable non-volatile memory assigned to a logical block address; and
solid state drive controller circuitry communicatively coupled to the persistent memory and the block addressable non-volatile memory, the solid state drive controller circuitry comprising:
a volatile memory to store a logical to physical address indirection table cache; and
an assist circuitry communicatively coupled to the volatile memory, the assist circuitry to monitor the logical to physical address indirection table cache and to write dirty logical to physical entries in the logical to physical address indirection table cache to the logical to physical address indirection table in the persistent memory.

2. The solid state drive of claim 1, wherein the volatile memory to include a buffer to temporarily store data to be written by the assist circuitry to the block addressable non-volatile memory.

3. The solid state drive of claim 1, wherein in response to a command to write data to a logical address in the block addressable non-volatile memory, data is written to a physical address in the block addressable non-volatile memory and an entry in the logical to physical address indirection table cache associated with the physical address and the logical address is set to dirty.

4. The solid state drive of claim 1, wherein in response to a command to read data from a logical block address in the block addressable non-volatile memory, the logical to physical address indirection table cache is searched for an entry for a physical block address in the block addressable non-volatile memory associated with the logical block address.

5. The solid state drive of claim 1, wherein in response to a command to read data from a logical block address in the block addressable non-volatile memory, the logical to physical address indirection table in persistent memory is searched for an entry for a physical block address in the block addressable non-volatile memory associated with the logical block address.

6. The solid state drive of claim 1, wherein in response to a command to erase data from a logical block address in the block addressable non-volatile memory, the logical to physical address indirection table in persistent memory is searched for an entry for a physical block address in the block addressable non-volatile memory associated with the logical block address.

7. The solid state drive of claim 1, wherein the block addressable non-volatile memory is NAND and the persistent memory is three-dimensional cross-point.

8. A method comprising:
storing data in a block addressable non-volatile memory;
storing, in a persistent memory, a logical to physical address indirection table, the logical to physical address indirection table having a plurality of entries, each entry to store a physical block address in the block addressable non-volatile memory assigned to a logical block address; and
storing, in a volatile memory, a logical to physical address indirection table cache in a volatile memory; and
monitoring the logical to physical address indirection table cache and writing dirty logical to physical entries in the logical to physical address indirection table cache to the logical to physical address indirection table in the persistent memory.

9. The method of claim 8, wherein the volatile memory to include a buffer to temporarily store data to be written to the block addressable non-volatile memory.

10. The method of claim 9, further comprising:
in response to a command to write data to a logical address in the block addressable non-volatile memory, writing data to a physical address in the block addressable non-volatile memory; and
setting an entry in the logical to physical address indirection table cache associated with the physical address and the logical address to dirty.

11. The method of claim 10, further comprising:
in response to a command to read data from a logical block address in the block addressable non-volatile memory, searching the logical to physical address indirection table cache for an entry for a physical block address in the block addressable non-volatile memory associated with the logical block address.

12. The method of claim 11, further comprising:
in response to a command to read data from a logical block address in the block addressable non-volatile memory, searching the logical to physical address indirection table in persistent memory for an entry for a physical block address in the block addressable non-volatile memory associated with the logical block address.

13. The method of claim 12, further comprising:
in response to a command to erase data from a logical block address in the block addressable non-volatile memory, searching the logical to physical address indirection table in persistent memory for an entry for a physical block address in the block addressable non-volatile memory associated with the logical block address.

14. The method of claim 8, wherein the block addressable non-volatile memory is NAND and the persistent memory is three-dimensional cross-point memory.

15. A system comprising:
a processor;
a solid state drive communicatively coupled the processor, the solid state drive comprising:
a block addressable non-volatile memory to store data;
a persistent memory to store a logical to physical address indirection table, the logical to physical address indirection table having a plurality of entries, each entry to store a physical block address in the block addressable non-volatile memory assigned to a logical block address; and
solid state drive controller circuitry communicatively coupled to the persistent memory and the block addressable non-volatile memory, the solid state drive controller circuitry comprising:
a volatile memory to store a logical to physical address indirection table cache; and
an assist circuitry communicatively coupled to the volatile memory, the assist circuitry to monitor the logical to physical address indirection table cache and to write dirty logical to physical entries in the logical to physical address indirection table cache to the logical to physical address indirection table in the persistent memory.

16. The system of claim 15, wherein the volatile memory to include a buffer to temporarily store data to be written by the assist circuitry to the block addressable non-volatile memory.

17. The system of claim 15, wherein in response to a command to write data to a logical address in the block addressable non-volatile memory, data is written to a physical address in the block addressable non-volatile memory and an entry in the logical to physical address indirection table cache associated with the physical address and the logical address is set to dirty.

18. The system of claim 15, wherein in response to a command to read data from a logical block address in the block addressable non-volatile memory, the logical to physical address indirection table cache is searched for an entry for a physical block address in the block addressable non-volatile memory associated with the logical block address.

19. The system of claim 15, wherein in response to a command to read data from a logical block address in the block addressable non-volatile memory, the logical to physical address indirection table in persistent memory is searched for an entry for a physical block address in the block addressable non-volatile memory associated with the logical block address.

20. The system of claim 15, wherein in response to a command to erase data from a logical block address in the block addressable non-volatile memory, the logical to physical address indirection table in persistent memory is searched for an entry for a physical block address in the block addressable non-volatile memory associated with the logical block address.

\* \* \* \* \*